United States Patent [19]

Stuebing

[11] Patent Number: 4,857,760
[45] Date of Patent: Aug. 15, 1989

[54] BIPOLAR GLITCH DETECTOR CIRCUIT

[75] Inventor: Carlton Stuebing, Tigard, Oreg.

[73] Assignee: Tektronix, Inc., Beaverton, Oreg.

[21] Appl. No.: 154,679

[22] Filed: Feb. 10, 1988

[51] Int. Cl.$^4$ .......................... H03K 5/22; H03K 5/04
[52] U.S. Cl. .................................... 307/234; 307/265;
307/518; 328/111; 328/58; 328/109
[58] Field of Search ............... 307/234, 360, 518, 265;
328/135, 114, 147, 111, 58, 109, 110, 112;
455/608, 618

[56] References Cited

U.S. PATENT DOCUMENTS

| | | | |
|---|---|---|---|
| 2,794,123 | 5/1957 | Younker | 328/58 |
| 3,408,581 | 10/1968 | Wakamoto et al. | 328/108 |
| 3,996,586 | 12/1976 | Dillon et al. | 328/111 |
| 4,197,502 | 4/1980 | Sumner et al. | 307/518 |
| 4,318,047 | 3/1982 | Dawson | 307/234 |
| 4,342,965 | 8/1982 | Baldwin | 307/234 |
| 4,353,032 | 10/1982 | Taylor | 328/165 |
| 4,495,621 | 1/1985 | Nakagomi et al. | 307/234 |
| 4,495,642 | 2/1982 | Zellmer | 382/1 |
| 4,497,068 | 1/1985 | Fischer | 307/234 |
| 4,529,892 | 7/1985 | Reilly et al. | 307/360 |
| 4,531,223 | 7/1985 | Ashida | 328/111 |
| 4,567,601 | 1/1986 | Mountain | 328/111 X |
| 4,694,200 | 9/1987 | Hetyei | 307/234 |

OTHER PUBLICATIONS

D. S. Jain, "Detect Out-of-Bound Pulse Widths," EDN, Sep. 19, 1985, p. 242.

Primary Examiner—Stanley D. Miller
Assistant Examiner—Huy K. Mai
Attorney, Agent, or Firm—Edward B. Anderson; Peter J. Meza

[57] ABSTRACT

A circuit for detecting positive and negative pulses of a predetermined maximum duration of an input signal includes a first monostable circuit for generating a first pulse having a duration equal to the predetermined maximum duration when a positive-going edge of a pulse occurs in the input signal. A second monostable circuit is provided for generating a second pulse also having a duration equal to the predetermined maximum duration when a negative-going edge of a pulse occurs in the input signal. An AND gate is coupled to the output of the first and second monostable circuits for generating a signal having a third pulse equal to the period of time both of the first and second pulses occur simultaneously. A flip-flop is coupled to the output of the AND gate for generating an output signal of a first logic state when the third pulse is generated. The flip-flop is also responsive to an external reset signal for setting the output signal at a second logic state when it is desired to detect further pulses in the input signal.

3 Claims, 1 Drawing Sheet

BIPOLAR GLITCH DETECTOR CIRCUIT

FIELD OF THE INVENTION

This invention relates to circuits for detecting specified types of pulses, and in particular, to such circuits for detecting both positive and negative going pulses.

BACKGROUND OF THE INVENTION

For purposes of this application, the term glitch refers generally to a pulse having a width less than a predetermined width. For example, in triggering oscilloscopes, it is desired to determine whether certain unusual pulses are occurring in a particular signal other than data or other desired pulses. Such pulses typically would have a shorter duration than the data pulses.

A glitch detector circuit, such as the one provided by the present invention, senses each pulse in the data signal. When a pulse occurs which has a shorter duration than the data pulse, or a predetermined width which is less than the data pulse, an output signal is generated indicating the occurrence of the pulse. When used with an analog circuit, particularly an analog oscilloscope, this output signal is used to determine when to begin a sweep of the subject signal to obtain a display of the glitch. If the subject signal is being stored in digital form, the signal generated by the invention determines when the storing of information digitally may be terminated, and the digitally stored data displayed.

In certain applications, both positive and negative (bipolar) data pulses are used. However, even in some monopolar applications both positive and negative glitches occur in the signal. It is therefore desirable to detect both positive and negative going glitches.

Circuits presently exist which detect bipolar glitches as described. However, such circuits tend to be very complex and therefore more costly to manufacture.

SUMMARY OF THE INVENTION

The present invention provides a bipolar glitch detector circuit which has relatively few components and operates over a wide range of possible detected pulse widths. Such a circuit is economical and quick to manufacture and is straightforward in its operation.

These features are provided by a circuit for detecting positive and negative pulses of a predetermined maximum duration of an input signal. Means are provided for sensing the positive-going edges and negative-going edges of input signal pulses. Further, means coupled to both of the positive-going and negative-going edge sensing means are provided for generating an output signal indicative of when a positive-going edge and a negative-going edge of an input signal pulse occur within a predetermined period of time equal to the predetermined maximum duration.

In the preferred embodiment of the present invention, a plus-edge triggered monostable circuit is used to detect the occurrence of a positive-going pulse. The input signal is inverted and coupled to a second plus-edge triggered monostable circuit, making it a minus-edge triggered circuit. The outputs of these two circuits are input to an AND gate. The AND gate thus generates an output indicative of when both monostable pulses exist. By making the length of the monostable pulses equal to the desired maximum pulse length these then provide an indication of the occurrence of a glitch in the input signal. This circuit functions regardless of the order of the positive and negative going pulse edges.

It will thus be appreciated that the present invention provides a glitch detector formed of very few fundamental functional components and is able to detect both positive and negative pulses, i.e., it is a bipolar glitch detecting circuit. These and other features and advantages of the present invention will become more apparent from a review of the drawings and the following detailed description of the preferred embodiment.

DETAILED DESCRIPTION OF THE PREFERRED EMBODIMENT

Figure 1:
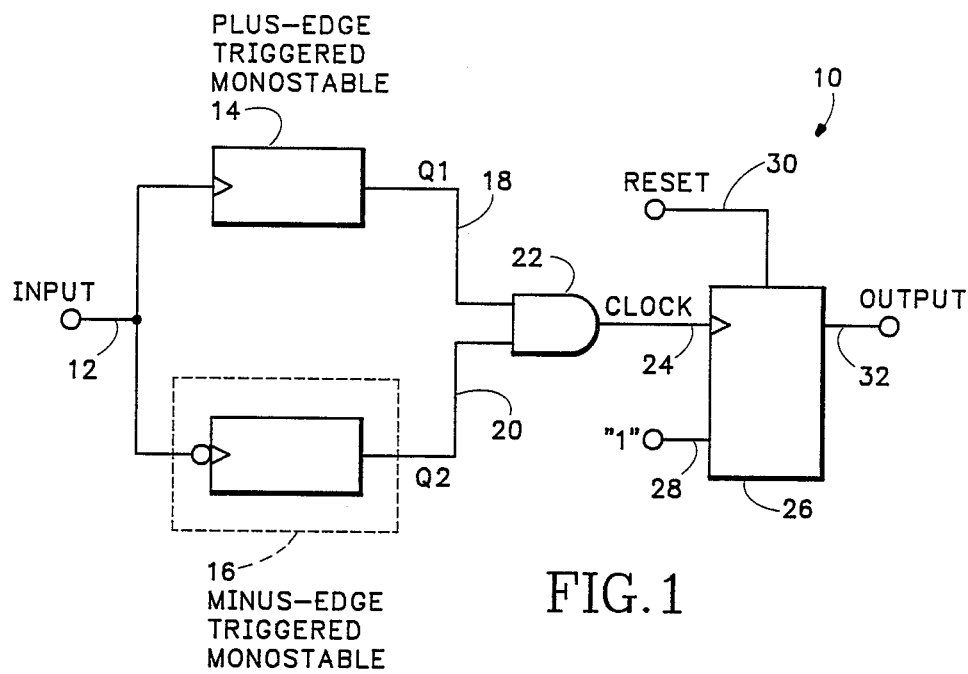
FIG. 1 is a block diagram of a bipolar glitch detector circuit made according to the present invention.

Referring initially to FIG. 1, a glitch detector circuit made according to the present invention is shown generally at 10. Circuit 10 is responsive to an "Input" signal on a lead 12 for determining whether glitches exist. The input signal is input into a plus-edge triggered monostable circuit 14. This circuit can be of a conventional monostable circuit structure. Alternatively, and preferably, it is made as described in my copending patent application entitled SELF-LATCHING MONOSTABLE CIRCUIT, assigned to the same assignee as the present invention. This monostable circuit is externally controllable to provide a wide range of pulse widths and is therefore particularly suitable for use in an oscilloscope triggering system.

The input signal is also input to the same circuit after being inverted to produce a minus-edge triggered monostable circuit 16. The output of monostable 14, identified as "Q1", is on a lead 18 and the output of monostable 16, identified as "Q2", is output on a lead 20.

Leads 18 and 20 are connected to the two input ports of an AND gate 22. The output of the AND gate, identified as "Clock" as shown on a lead 24 is connected to the clock input of a D flip-flop 26. The flip-flop preferably has the D input connected to a lead 28 having a voltage corresponding to a logic one. The flip-flop also has its reset port connected to an external system reset on a lead 30.

In an oscilloscope, the system reset is used to provide general control of various circuits including the triggering circuit. As mentioned previously, it is essentially used to determine when it is desired to begin observing the input signal to determine and display any glitches occurring on it. Finally, the output of flip-flop 26 is provided on an "Output" lead 32.

Figure 2:
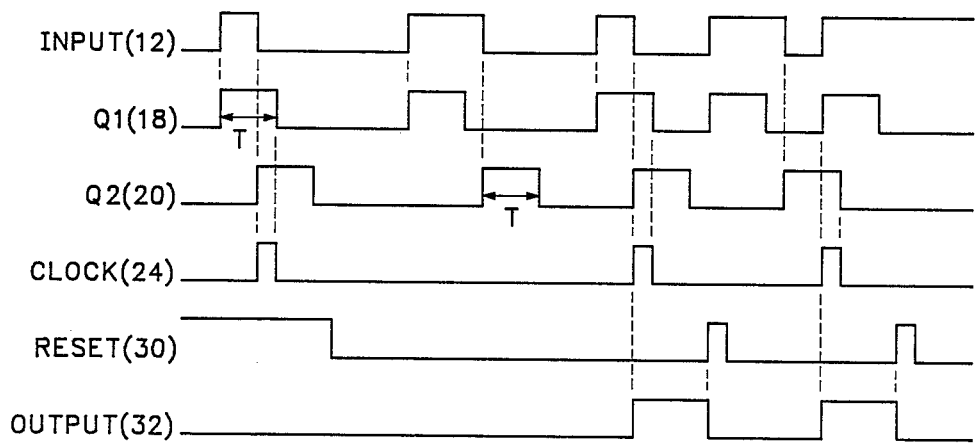
FIG. 2 is a chart showing waveforms at various locations in the circuit of FIG. 1 during operation.

Referring now to FIG. 2, the input signal is shown as the top waveform. This signal includes a short initial pulse the positive-going leading edge of which triggers monostable 14 to produce a pulse of the predetermined duration, shown as T in the figure. The negative-going trailing edge of the input pulse causes monostable 16 also to produce a pulse of the same duration but delayed in time. As shown, these pulses on leads 18 and 20 overlap in time by an amount shown as the pulse produced on the clock signal on lead 24. However, it can be seen during the occurrence of these pulses that reset signal on lead 30 is in a high state, thereby preventing the operation of flip-flop 26. Thus, even though the initial pulse shown on the input signal is shorter than the monostable pulses, no output is generated.

The second pulse on the input lead is a wide pulse, such as a data pulse, which has a duration greater than the duration of the monostable output pulses. Thus, both monostable 14 and 16 generate pulses Q1 and Q2 but because they do not overlap in time, there is no resulting pulse from AND gate 22, and therefore no output on lead 32.

The third input signal pulse is another narrow positive-going pulse which is narrower than the pulses of monostables 14 and 16. The resulting pulses generated on leads 18 and 20 from the monostables produce a clock pulse. Since the reset signal on lead 30 is in a low state, flip-flop 26 is enabled. Thus when the pulse on lead 24 is received by the flip-flop, the output on lead 32 is changed from a low to a high state. It continues on this high state until a reset pulse occurs on lead 30, as shown.

The fourth and fifth positive-going pulses shown in FIG. 2 on input lead 12 results in a pulse initially longer than the monostable pulses. The two positive pulses are separated by what can be considered a narrow negative-going pulse which also forms a glitch on the input signal. The resulting sequence is as follows. A pulse in generated by monostable 14 in response to the positive-going edge of the fourth pulse. The negative-going edge of this pulse produces a pulse on Q2 which is after the completion of the pulse generated by monostable 14. Thus, no clock pulse results in this instance. However, a second pulse is generated by monostable 14 resulting from the next occurring positive-going pulse edge on input lead 12. Because this positive-going pulse edge occurs within a time period less than the width of the pulse generated by monostable 16, there again is a period of overlap between the two monostable output pulses. This results in the third clock pulse shown in FIG. 2. This clock pulse again causes flip-flop 26 to produce an output which is high. This output again remains high until another reset pulse is received on lead 30. After the reset pulse, the circuit is again in condition to respond to the next occurring glitch.

If two very narrow pulses, either positive or negative, occur within a period of time of less than the width of the output pulse of the nonretriggerable monostables, the second pulse will not produce a clock pulse. However, because the first of the two small glitches does produce a clock pulse, the signal containing the two glitches will be recovered and displayed, depending on the timing of the oscilloscope sweep or memory for display.

It will therefore be appreciated that the preferred embodiment of the present invention provides a very straightforward circuit made of a few fundamental functional building blocks. The particular monostables chosen can be easily varied, as described in my previously identified copending application, to provide triggering for a wide range of glitch pulse widths. Further, because of its simplicity, it is economical to manufacture and takes up very little integrated circuit surface area. It will therefore be appreciated by those skilled in the art that, although the invention has been described with reference to the foregoing preferred embodiment, changes in form and detail may be made without varying from the scope and spirit of the invention as described in the claims.

I claim:

1. A circuit for detecting positive and negative pulses of a predetermined maximum duration of an input signal comprising:
   a first monostable circuit for generating a first pulse having a duration equal to the predetermined maximum duration when a positive-going edge of a pulse occurs in the input signal;
   a second monostable circuit for generating a second pulse also having a duration equal to the predetermined maximum duration when a negative-going edge of a pulse occurs in the input signal;
   AND gate means coupled to said first and second monostable circuits for generating a signal having a third pulse equal to the period of time both of said first and second pulses are present; and
   flip-flop means coupled to the output of said AND gate means for generating an output signal of a first logic state when the third pulse is generated, said flip-flop means also being responsive to an external reset signal for setting the output signal at a second logic state.

2. A circuit for detecting positive and negative pulses of a predetermined maximum duration of an input signal comprising:
   a positive edge triggered monostable circuit for sensing the positive-going edge of an input signal pulse and for generating a pulse having a duration equal to the predetermined maximum duration;
   a negative edge triggered monostable circuit for sensing the negative-going edge of an input signal pulse and for generating a pulse having a duration equal to the predetermined maximum duration; and
   AND gate means coupled to both of said positive and negative edge triggered monostable circuits for generating a pulse having a duration equal to the period of time when pulses from the positive and the negative edge triggered monostable circuit are present, wherein the pulse produced by the AND gate means is an output signal indicative of when a positive-going edge and a negative-going edge of an input signal pulse occur within the predetermined maximum duration.

3. A circuit for detecting positive and negative pulses of a predetermined maximum duration of an input signal comprising:
   means for sensing the positive-going edge of an input signal pulse;
   means for sensing the negative-going edge of an input signal pulse; and
   means coupled to both of said positive-going and negative-going edge sensing means for generating an output signal indicative of when a positive-going edge and a negative-going edge of an input signal pulse occur within a predetermined period of time equal to the predetermined maximum duration, wherein said output signal has a first logic state prior to the occurrence of a positive-going edge and a negative-going edge within the predetermined period of time, and has a second logic state after the occurrence of a positive-going edge and a negative-going edge within the predetermined period of time, and wherein said generating means is responsive to an external reset signal for resetting said output signal to said first logic state.

* * * * *